(12) United States Patent
Shinohara

(10) Patent No.: US 11,710,716 B2
(45) Date of Patent: *Jul. 25, 2023

(54) ANISOTROPIC CONDUCTIVE FILM AND METHOD OF PRODUCING THE SAME

(71) Applicant: DEXERIALS CORPORATION, Shimotsuke (JP)

(72) Inventor: Seiichiro Shinohara, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/738,655

(22) Filed: May 6, 2022

(65) Prior Publication Data

US 2022/0262760 A1    Aug. 18, 2022

Related U.S. Application Data

(63) Continuation of application No. 16/694,212, filed on Nov. 25, 2019, now Pat. No. 11,404,391, which is a (Continued)

(30) Foreign Application Priority Data

Aug. 24, 2012   (JP) ................. 2012-184833

(51) Int. Cl.
*B32B 37/06*   (2006.01)
*B32B 37/10*   (2006.01)
(Continued)

(52) U.S. Cl.
CPC .............. *H01L 24/29* (2013.01); *B32B 3/263* (2013.01); *B32B 37/025* (2013.01); *B32B 37/06* (2013.01);
(Continued)

(58) Field of Classification Search
None
See application file for complete search history.

(56) References Cited

U.S. PATENT DOCUMENTS 6,034,331 A    3/2000   Tsukagoshi et al.
10,272,598 B2 *  4/2019   Shinohara .................. C09J 7/10
(Continued)

FOREIGN PATENT DOCUMENTS

CN    1217828 A    5/1999
CN    1926675 A    3/2007
(Continued)

OTHER PUBLICATIONS

May 6, 2022 Office Action issued in Taiwanese Patent Application No. 109145247.
(Continued)

*Primary Examiner* — Ramsey Zacharia
(74) *Attorney, Agent, or Firm* — Oliff PLC

(57) ABSTRACT

An anisotropic conductive film has a three-layer structure in which a first connection layer is sandwiched between a second connection layer and a third connection layer that each are formed mainly of an insulating resin. The first connection layer has a structure in which conductive particles are arranged in a single layer in the plane direction of an insulating resin layer on a side of the second connection layer, and the thickness of the insulating resin layer in central regions between adjacent ones of the conductive particles is smaller than that of the insulating resin layer in regions in proximity to the conductive particles.

13 Claims, 7 Drawing Sheets

Related U.S. Application Data continuation of application No. 14/422,511, filed as application No. PCT/JP2013/072571 on Aug. 23, 2013, now abandoned.

(51) Int. Cl.

| | | |
|---|---|---|
| *B32B 37/24* | (2006.01) | |
| *B32B 38/00* | (2006.01) | |
| *C08G 59/68* | (2006.01) | |
| *H01L 23/00* | (2006.01) | |
| *H05K 3/32* | (2006.01) | |
| *C09J 4/00* | (2006.01) | |
| *H05K 1/03* | (2006.01) | |
| *B32B 3/26* | (2006.01) | |
| *B32B 37/00* | (2006.01) | |

(52) U.S. Cl.
CPC .............. *B32B 37/10* (2013.01); *B32B 37/24* (2013.01); *B32B 38/0008* (2013.01); *C08G 59/68* (2013.01); *H01L 24/27* (2013.01); *H01L 24/83* (2013.01); *H05K 3/323* (2013.01); *B32B 2037/243* (2013.01); *B32B 2305/30* (2013.01); *B32B 2307/202* (2013.01); *B32B 2457/00* (2013.01); *C09J 4/00* (2013.01); *H01L 2224/27003* (2013.01); *H01L 2224/27005* (2013.01); *H01L 2224/294* (2013.01); *H01L 2224/2919* (2013.01); *H01L 2224/2929* (2013.01); *H01L 2224/2939* (2013.01); *H01L 2224/29076* (2013.01); *H01L 2224/29082* (2013.01); *H01L 2224/29083* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/29499* (2013.01); *H01L 2224/83851* (2013.01); *H01L 2924/12042* (2013.01); *H01L 2924/15788* (2013.01); *H01L 2924/181* (2013.01); *H05K 1/0373* (2013.01); *H05K 2201/0215* (2013.01); *Y10T 428/24521* (2015.01)

(56) References Cited

U.S. PATENT DOCUMENTS

| | | | |
|---|---|---|---|
| 11,404,391 B2 * | 8/2022 | Shinohara | ............... H01L 24/83 |
| 2003/0178221 A1 | 9/2003 | Chiu et al. | |
| 2007/0040153 A1 | 2/2007 | Jung et al. | |
| 2007/0092698 A1 | 4/2007 | Ishida et al. | |
| 2008/0090943 A1 | 4/2008 | Xu et al. | |
| 2008/0303140 A1 | 12/2008 | Ohtani et al. | |
| 2009/0090545 A1 | 4/2009 | Usui et al. | |
| 2010/0277885 A1 | 11/2010 | Tatsuzawa et al. | |
| 2011/0110066 A1 | 5/2011 | Yamada et al. | |
| 2012/0125671 A1 | 5/2012 | Sato et al. | |
| 2014/0355226 A1 | 12/2014 | Kim et al. | |

FOREIGN PATENT DOCUMENTS

| | | |
|---|---|---|
| CN | 101432931 A | 5/2009 |
| CN | 101611066 A | 12/2009 |
| JP | 2000-178511 A | 6/2000 |
| JP | 2001-240816 A | 9/2001 |
| JP | 2003-220669 A | 8/2003 |
| JP | 2003-286456 A | 10/2003 |
| JP | 2003-286457 A | 10/2003 |
| JP | 2005-235530 A | 9/2005 |
| JP | 2005-314696 A | 11/2005 |
| JP | 2008034232 A | 2/2008 |
| JP | 2008-214449 A | 9/2008 |
| JP | 2010-033793 A | 2/2010 |
| JP | 2011-070931 A | 4/2011 |
| JP | 2011-071108 A | 4/2011 |
| JP | 2014-044947 A | 3/2014 |
| JP | 2014-60150 A | 4/2014 |
| JP | 2016-201405 A | 12/2016 |
| KR | 10-2008-0111500 A | 12/2008 |
| KR | 10-2011-0049559 A | 5/2011 |
| KR | 2011-0122225 A | 11/2011 |
| TW | I728136 B | 5/2021 |
| WO | 2007/125993 A1 | 11/2007 |
| WO | 2011/059084 A1 | 5/2011 |
| WO | 2012/063554 A1 | 5/2012 |

OTHER PUBLICATIONS

May 17, 2022 Office Action issued in Korean Patent Application No. 10-2021-7016075.
Nov. 26, 2013 International Search Report issued in International Patent Application No. PCT/JP2013/072571.
Apr. 11, 2016 Office Action issued in Korean Patent Application No. 10-2014-7035905.
May 17, 2016 Office Action issued in Japanese Patent Application No. 2013-173195.
May 26, 2016 Office Action issued in Chinese Patent Application No. 201380044397.8.
Oct. 31, 2016 Office Action issued in Korean Patent Application No. 10-2014-7035905.
Feb. 2, 2017 Office Action issued in Taiwanese Patent Application No. 102130402.
Mar. 16, 2017 Office Action issued in Chinese Patent Application No. 201380044397.8.
Jun. 16, 2017 Office Action issued in Japanese Patent Application No. 2016-201524.
Oct. 9, 2017 Office Action in Chinese Patent Application No. 201380044397.8.
Nov. 16, 2017 Office Action issued in U.S. Appl. No. 14/422,511.
Nov. 2, 2017 Office Action issued in Taiwanese Patent Application No. 102130402.
Nov. 26, 2013 Search Report issued in International Application No. PCT/JP2013/072617.
Jan. 21, 2016 Office Action issued in U.S. Appl. No. 14/422,470.
Dec. 8, 2015 Taiwanese Office Action issued in Taiwanese Application No. 102130401.
May 17, 2016 Notification of Reasons for Refusal issued in Japanese Patent Application No. 2013-173698.
Jun. 22, 2016 Office Action issued in Chinese Patent Application No. 201380043932.8.
Jul. 1, 2016 Notice of Grounds for Rejection issued in Korean Patent Application No. 2015-7001171.
Aug. 12, 2016 Office Action issued in U.S. Appl. No. 14/422,470.
Mar. 23, 2017 Office Action issued in U.S. Appl. No. 14/422,470.
U.S. Appl. No. 14/422,511, filed Feb. 19, 2015 in the name of Shinohara.
U.S. Appl. No. 14/422,470, filed Feb. 19, 2015 in the name of Shinohara et al.
Nov. 22, 2017 Notice of Allowance issued in U.S. Appl. No. 14/422,470.
Jul. 24, 2017 Advisory Action issued in U.S. Appl. No. 14/422,470.
Jun. 19, 2018 Office Action Issued in U.S. Appl. No. 14/422,511.
Jun. 26, 2018 Office Action issued in U.S. Appl. No. 14/422,470.
Jun. 22, 2018 Office Action Issued in Taiwanese Patent Application No. 106120898.
Jun. 22, 2018 Office Action Issued in Taiwanese Patent Application No. 106120899.
Aug. 6, 2018 Office Action Issued in Taiwanese Patent Application No. 102130402.
Sep. 14, 2018 Office Action issued in Korean Patent Application No. 10-2017-7006454.
Nov. 15, 2018 Office Action Issued in Korean Patent Application No. 10-2017-7006541.
Jan. 8, 2019 Office Action Issued in Japanese Patent Application No. 2018-086166.

(56) References Cited

OTHER PUBLICATIONS

Jan. 22, 2018 Office Action Issued in Japanese Patent Application No. 2018-086174.
Jan. 30, 2019 Office Action Issued in Taiwanese Patent Application No. 106120899.
Nov. 1, 2018 Office Action issued in U.S. Appl. No. 14/422,511.
May 6, 2019 Office Action issued in U.S. Appl. No. 14/422,511.
Jun. 10, 2019 Office Action Issued in Japanese Patent Application No. 2018-86166.
Jul. 4, 2019 Office Action issued in Chinese Application No. 201810699544.X.
Oct. 31, 2019 Office Action issued in U.S. Appl. No. 16/369,539.
Oct. 9, 2019 Office Action issued in Japanese Patent Application No. 2018-086166.
Dec. 2, 2019 Office Action issued in Korean Patent Application No. 10-2019-7025499.
Sep. 24, 2021 Reconsideration Report by Examiner Before Appeal issued in Japanese Patent Application No. 2019-168643.
Nov. 1, 2019 Office Action issued in Chinese Patent Application No. 201710413040.2.
Dec. 24, 2019 Office Action issued in Japanese Patent Application No. 2018-086166.
Nov. 13, 2019 Office Action issued in Chinese Patent Application No. 201710413926.7.
Mar. 3, 2020 Office Action issued in Chinese Patent Application No. 201810699544.X.
Mar. 17, 2020 Office Action issued in Japanese Patent Application No. 2018-086166.
Mar. 5, 2020 Office Action issued in Chinese Patent Application No. 201810699580.6.
Jul. 15, 2020 Office Action issued in U.S. Appl. No. 16/369,539.
Jun. 19, 2020 Office Action issued in Taiwanese Patent Application No. 106120899.
Jun. 18, 2020 Office Action issued in Taiwanese Patent Application No. 108111322.
Jul. 28, 2020 Office Action issued in Japanese Patent Application No. 2018-086166.
Aug. 17, 2021 Office Action issued in Japanese Patent Application No. 2019-192686.
Aug. 7, 2020 Office Action issued in Chinese Patent Application No. 201810699544.X (with partial translation).
Aug. 6, 2020 Office Action issued in Chinese Patent Application No. 201710413926.7.
Sep. 9, 2020 Office Action issued in Chinese Patent Application No. 201710413040.2.
Nov. 17, 2020 Office Action issued in Japanese Patent Application No. 2019-168643.
Dec. 10, 2020 Office Action issued in Chinese Patent Application No. 201810699580.6.
Jan. 26, 2021 Notification of Reason(s) for Refusal issued in Japanese Patent Application No. 2019-192686.
Mar. 25, 2021 Office Action issued in Chinese Patent Application No. 201710413040.2.
Apr. 27, 2021 Trial and Appeal Decision issued in Japanese Patent Application No. 2018-086166.
Feb. 15, 2022 Notice of Reasons for Refusal issued in Japanese Patent Application No. 2019-168643.
Jun. 1, 2021 Office Action issued in Japanese Patent Application No. 2019-168643.
Apr. 27, 2022 Notification of Reason for Refusal issued in Korean Patent Application No. 10-2021-7042801.
Jul. 26, 2022 Notification of Reasons for Refusal issued in Japanese Patent Application No. 2021-132546.
Oct. 6, 2022 Office Action issued in U.S. Appl. No. 17/403,072.
Aug. 25, 2022 Office Action issued in Taiwanese Patent Application No. 110114138.
Nov. 21, 2022 Office Action issued in Taiwanese Patent Application No. 109145247.
Nov. 22, 2022 Notification of Reasons for Refusal issued in Japanese Patent Application No. 2021-187236.
Mar. 20, 2023 Office Action issued in Korean Patent Application No. 10-2021-7016075.
Apr. 11, 2023 Office Action issued in U.S. Appl. No. 17/403,072.

\* cited by examiner

ANISOTROPIC CONDUCTIVE FILM AND METHOD OF PRODUCING THE SAME

This application is a continuation application of U.S. application Ser. No. 16/694,212 filed Nov. 25, 2019, which in turn is a continuation application of U.S. application Ser. No. 14/422,511 filed Feb. 19, 2015 (now abandoned), which in turn is a U.S. national stage application of PCT/JP2013/072571 filed Aug. 23, 2013. The disclosure of each of the prior applications is incorporated herein by reference in its entirety.

TECHNICAL FIELD

The present invention relates to an anisotropic conductive film and a method of producing the same.

BACKGROUND ART

An anisotropic conductive film has been widely used in mounting of an electronic component such as an IC chip. In recent years, an anisotropic conductive film in which conductive particles for anisotropic conductive connection are arranged in a single layer on an insulating adhesive layer has been proposed (Patent Literature 1), in order to improve the connection reliability and the insulating properties, improve the particle capturing efficiency, and decrease the production cost in terms of application to high-density mounting.

This anisotropic conductive film is produced as follows. Conductive particles are first held in openings of a transfer die with the openings, and an adhesive film with an adhesive layer for transfer is pressed onto the conductive particles to primarily transfer the conductive particles to the adhesive layer. Subsequently, a polymer film that becomes a component of the anisotropic conductive film is pressed on the conductive particles attached to the adhesive layer, and heated and pressurized to secondarily transfer the conductive particles to a surface of the polymer film. An adhesive layer is formed on a surface of the polymer film including the secondarily transferred conductive particles on a side of the conductive particles so as to cover the conductive particles, whereby this anisotropic conductive film is produced.

CITATION LIST

Patent Literature

Patent Literature 1: Japanese Patent Application Laid-Open No. 2010-33793

SUMMARY OF INVENTION

Technical Problem

The connection reliability, the insulating properties, and the particle capturing efficiency of the anisotropic conductive film of Patent Literature 1, which is produced using the transfer die with openings, may be expected to be improved to some extent as long as primary transfer and secondary transfer proceed smoothly. However, generally, a film with relatively low adhesive force is used as an adhesive film for primary transfer to facilitate secondary transfer, and a contact area of the conductive particles with the adhesive film is decreased. For this reason, during a primary transfer process to a secondary transfer process, some conductive particles are not primarily transferred. Further, some conductive particles peel from the adhesive film after primary transfer, and some conductive particles shift on the adhesive film. Thus, the entire operation efficiency may be reduced.

On the other hand, when for a smooth primary transfer operation at high speed, the adhesive force of the adhesive film is increased to some extent, the conductive particles are stably held on the adhesive film. However, this may cause the conductive particles to be difficult to be secondarily transferred to the polymer film. When the film property of the polymer film is enhanced to avoid the above problem, another problem arises in which the conduction resistance of the anisotropic conductive film increases and the conduction reliability is also reduced. Even when the anisotropic conductive film is tried to be actually produced using the transfer die with openings as described above, primary transfer and secondary transfer do not always proceed smoothly. Therefore, the anisotropic conductive film has been still highly required to achieve all favorable connection reliability, favorable insulating properties, and favorable particle capturing efficiency.

An object of the present invention is to solve the problems in the conventional technology, and also to achieve favorable connection reliability, favorable insulating properties, and favorable particle capturing efficiency in an anisotropic conductive film that is produced using a transfer die with openings and has conductive particles arranged in a single layer.

Solution to Problem

The present inventor has found that the above object is achieved when an anisotropic conductive film is produced using a transfer die with openings by directly transferring conductive particles from the transfer die to an insulating resin layer constituting the anisotropic conductive film without primary transfer to an adhesive film so that the conductive particles are arranged in a single layer and the thickness of the insulating resin layer at a center between adjacent ones of the conductive particles is smaller than that of the insulating resin layer in regions in proximity to the conductive particles, and placing insulating resin layers that function as an adhesive layer on respective faces of the insulating resin layer in which the conductive particles are arranged in a single layer. Thus, the present invention has been completed.

Accordingly, the present invention provides an anisotropic conductive film having a three-layer structure in which a first connection layer is sandwiched between a second connection layer and a third connection layer that each are formed mainly of an insulating resin, wherein the first connection layer has a structure in which conductive particles are arranged in a single layer in a plane direction of an insulating resin layer on a side of the second connection layer, and the thickness of the insulating resin layer in central regions between adjacent ones of the conductive particles is smaller than the thickness of the insulating resin layer in regions in proximity to the conductive particles.

The present invention further provides a method of producing the above anisotropic conductive film, the method including the following steps (A) to (D).

<Step (A)>

The step of disposing conductive particles within openings of a transfer die with the openings, and placing an insulating resin layer formed on a release film so as to be opposed to a surface of the transfer die with the openings.

<Step (B)>

The step of applying pressure to the insulating resin layer from a side of the release film to press an insulating resin into the openings, to transfer the conductive particles to a surface of the insulating resin layer, to form a first connection layer, wherein the first connection layer has a structure in which the conductive particles are arranged in a single layer in a plane direction of the insulating resin layer, and the thickness of the insulating resin layer in central regions between adjacent ones of the conductive particles is smaller than that of the insulating resin layer in regions in proximity to the conductive particles.

<Step (C)>

The step of forming a second connection layer formed mainly of an insulating resin on a surface of the first connection layer on a side of the conductive particles.

<Step (D)>

The step of forming a third connection layer formed mainly of an insulating resin on a surface of the first connection layer on a side opposite to the second connection layer.

The present invention provides another method of producing the above anisotropic conductive film, the method including the following steps (a) to (c).

<Step (a)>

The step of disposing conductive particles within openings of a transfer die with the openings, and placing an insulating resin layer that has been bonded to a third connection layer in advance so as to be opposed to a surface of the transfer die with the openings.

<Step (b)>

The step of applying pressure to the insulating resin layer from a side of a release film to press an insulating resin into the openings, to transfer the conductive particles to a surface of the insulating resin layer, to form a first connection layer, wherein the first connection layer has a structure in which the conductive particles are arranged in a single layer in a plane direction of the insulating resin layer, and the thickness of the insulating resin layer in central regions between adjacent ones of the conductive particles is smaller than that of the insulating resin layer in regions in proximity to the conductive particles.

<Step (c)>

The step of forming a second connection layer formed mainly of an insulating resin on a surface of the first connection layer on a side of the conductive particles.

The present invention provides a connection structure in which a first electronic component is connected to a second electronic component by anisotropic conductive connection using the above-described anisotropic conductive film.

Moreover, the present invention provides a method of connecting a first electronic component to a second electronic component by anisotropic conductive connection using the above-described anisotropic conductive film, the method including: temporarily applying the anisotropic conductive film to the second electronic component through the third connection layer of the anisotropic conductive film; mounting the first electronic component on the anisotropic conductive film temporarily applied; and performing thermocompression bonding through the first electronic component.

Advantageous Effects of Invention

In the anisotropic conductive film of the present invention that has a three-layer structure in which the first connection layer is sandwiched between the second and third connection layers that each are insulative, the first connection layer has a structure in which the conductive particles are arranged in a single layer in a plane direction of an insulating resin layer on a side of the second connection layer, and a structure in which the thickness of the insulating resin layer at a center between adjacent ones of the conductive particles is smaller than that of the insulating resin layer in regions in proximity to the conductive particles. For this reason, the anisotropic conductive film having the conductive particles arranged in a single layer is allowed to achieve favorable connection reliability, favorable insulating properties, and favorable particle capturing efficiency.

DESCRIPTION OF EMBODIMENTS

Hereinafter, anisotropic conductive films of the present invention will be described in detail.

«Anisotropic Conductive Film»

Figure 1A:
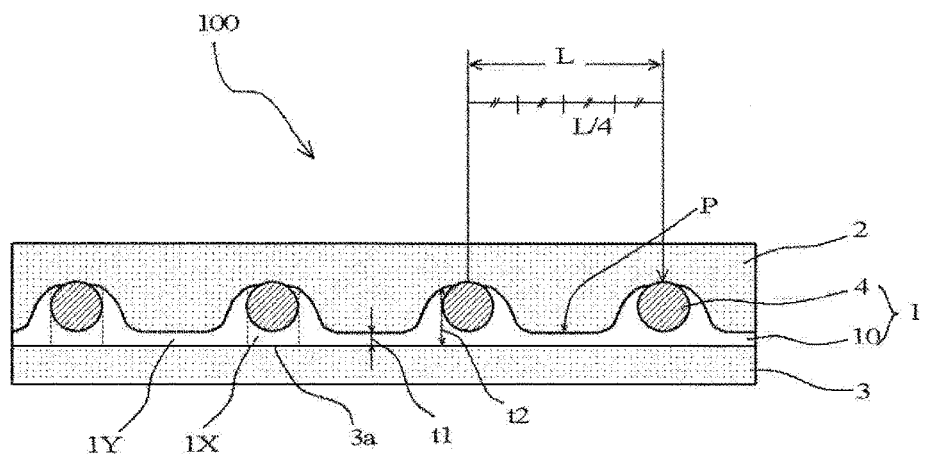
FIG. 1A is a cross-sectional view of an anisotropic conductive film of the present invention.
Figure 1B:
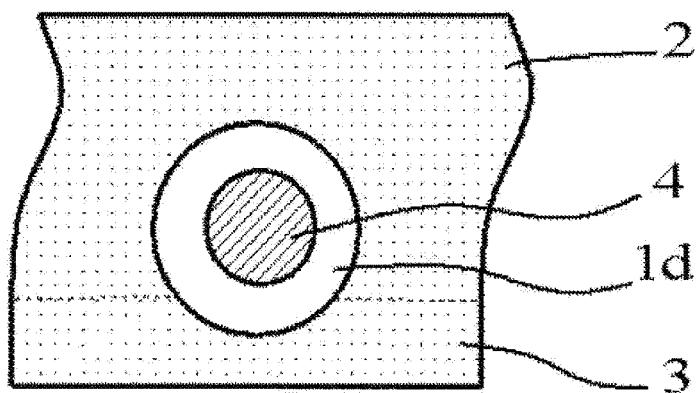
FIG. 1B is a cross-sectional view of the anisotropic conductive film of the present invention.

As shown in FIG. 1A, an anisotropic conductive film 100 of the present invention has a three-layer structure in which a first connection layer 1 is sandwiched between a second connection layer 2 and a third connection layer 3 that each are formed mainly of an insulating resin. The first connection layer 1 has a structure in which conductive particles 4 are arranged in a single layer in a plane direction of an insulating resin layer 10 on a side of the second connection layer 2. In this case, the conductive particles 4 may be close packed in the plane direction. It is preferable that the conductive particles 4 be arranged regularly (for example, in a square lattice) at constant intervals in the plane direction. Further, the first connection layer 1 has a structure in which a thickness t1 of the insulating resin layer in central regions between adjacent ones of the conductive particles 4 is smaller than a thickness t2 of the insulating resin layer in regions in proximity to the conductive particles 4. When the insulating resin layer thickness t1 is smaller than the insulating resin layer thickness t2, the conductive particles 4 that do not exist between terminals to be connected in anisotropic conductive connection are not used, and therefore the conductive particles 4 can prevent occurrence of short circuit. This is because the insulating resin layer between the conductive particles 4 melts by heating and pressurization during anisotropic conductive connection to cover the conductive particles 4, forming a coating layer 1*d*, as shown in FIG. 1B.

The central region between adjacent ones of the conductive particles 4 herein means a region that falls within a range of ±L/4 from a midpoint P of a distance L between the adjacent conductive particles. The region in proximity to the conductive particles means a position around a line segment that touches the conductive particles 4 in a thickness direction of the first connection layer 1.

It is preferable that the insulating resin layer thicknesses t1 and t2 further satisfy the following relation. This is because when the thickness t1 is much smaller than the thickness t2, the conductive particles 4 are likely to flow, and the particle capturing efficiency tends to decrease, and when the thickness t1 closely approximates to the thickness t2, the effects of the present invention are unlikely to be obtained.

$$0.1 \times t2 < t1 < 0.9 \times t2$$

When the absolute thickness of the insulating resin layer thickness t1 is too small, the first connection layer 1 may be unlikely to be formed. Therefore, it is preferably 0.5 μm or more. On the other hand, when the absolute thickness of the insulating resin layer thickness t2 is too large, the insulating resin layer 10 is unlikely to be removed from a connection region during anisotropic conductive connection, and conduction failure may occur. Therefore, it is preferably 6 μm or less.

Figure 1C:
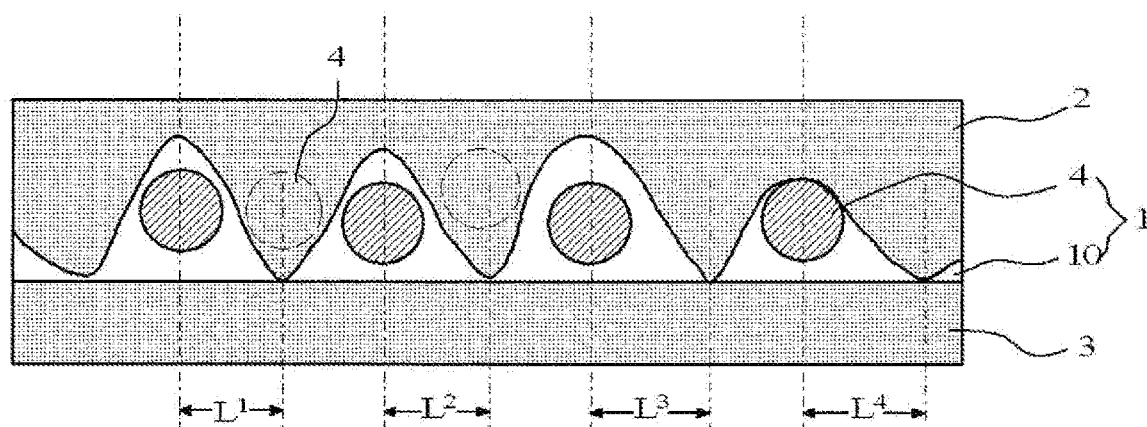
FIG. 1C is a cross-sectional view of the anisotropic conductive film of the present invention.

As shown in FIG. 1C, when the thickness of the resin layer containing the conductive particles largely varies in the plane direction and therefore, when the resin layer is divided, the thickness of the insulating resin layer between the conductive particles 4 may be substantially zero. The expression "substantially zero" means a state where divided insulating resin layers containing the conductive particle are each independent. In this case, the relational expression described above cannot be applied. Therefore, in order to achieve favorable connection reliability, favorable insulating properties, and favorable particle capturing efficiency, it is preferable that shortest distances $L^1$, $L^2$, $L^3$, $L^4$ . . . between a perpendicular line extending through the center of each conductive particle 4 and a position where the insulating resin layer thickness is the smallest be controlled. Specifically, when the shortest distances $L^1$, $L^2$, $L^3$, $L^4$ . . . are long, the amount of the resin in the first connection layer 1 relatively increases, and the productivity is improved. Therefore, the fluidity of the conductive particles 4 can be suppressed. In contrast, when the shortest distances $L^1$, $L^2$, $L^3$, $L^4$ . . . are short, the amount of the resin in the first connection layer 1 relatively decreases. Therefore, the distance between the particles can be easily controlled. Accordingly, the accuracy of position alignment of conductive particles can be improved. The distances $L^1$, $L^2$, $L^3$, $L^4$, . . . are preferably longer than 0.5 times and less than 1.5 times the particle diameter of the conductive particles 4, and more preferably within a range of 0.6 times to 1.2 times.

As shown in FIG. 1C, the conductive particles 4 may be embedded in the first connection layer 1. The degree of embedding, for example, shallow or deep depth, varies depending on the viscosity of a material during formation of the first connection layer 1, the shape or the size of openings of a transfer die for arranging the conductive particles, and the like. In particular, the degree of embedding can be controlled by a relation between the bottom diameter and the opening diameter of the openings. For example, it is preferable that the bottom diameter be 1.1 times or more and less than 2 times the diameter of the conductive particles and the opening diameter be 1.3 times or more and less than 3 times the diameter of the conductive particles.

Within a range not impairing the effects of the present invention, conductive particles 4' may be present in the second connection layer 2 as shown by dotted lines in FIG. 1C.

<First Connection Layer>

As the insulating resin layer 10 constituting such a first connection layer 1, a known insulating resin layer can be appropriately used. For example, a thermal- or photo-radical polymerizable resin layer containing an acrylate compound and a thermal- or photo-radical polymerization initiator or a layer obtained by subjecting the thermal- or photo-radical polymerizable resin layer to thermal- or photo-radical polymerization; or a thermal- or photo-cationic or anionic polymerizable resin layer containing an epoxy compound and a thermal- or photo-cationic or anionic polymerization initiator or a layer obtained by subjecting the thermal- or photo-cationic or anionic polymerizable resin layer to thermal- or photo-cationic or anionic polymerization can be used.

In particular, as the insulating resin layer 10 constituting the first connection layer 1, a thermal-radical polymerizable resin layer containing an acrylate compound and a thermal-radical polymerization initiator may be used. It is preferable that a photo-radical polymerizable resin layer containing an acrylate compound and a photo-radical polymerization initiator be used. In this case, when the photo-radical polymerizable resin layer is irradiated with ultraviolet rays to perform photo-radical polymerization, the first connection layer 1 can be formed. When the photo-radical polymerizable resin layer is irradiated with ultraviolet rays from a side of the conductive particles before formation of the second connection layer 2 to perform photo-radical polymerization, the degree of cure of a region 1X between the conductive particles 4 and a surface 3*a* of the third connection layer 3 in the first connection layer 1, as shown in FIG. 1A, can be made lower than that of a region 1Y between the adjacent ones of the conductive particles. Therefore, the minimum melt viscosity in the region 1X where the degree of cure in the first connection layer is low can be made lower than that in the region 1Y where the degree of cure in the first connection layer is high. During anisotropic conductive connection, the position of the conductive particles 4 can be prevented from shifting, the particle capturing efficiency can be improved, the pressing property of the conductive particles 4 can be improved, and the conduction resistance can be decreased. Accordingly, favorable conduction reliability can be achieved.

The degree of cure herein represents a value defined as a decrease ratio of a functional group contributing to polymerization (for example, vinyl group). Specifically, when the amount of vinyl group after curing is 20% of that before curing, the degree of cure is 80%. The amount of vinyl group can be measured by analysis of characteristic absorption of vinyl group in infrared absorption spectrum.

The degree of cure defined above in the region 1X is preferably 40 to 80%, and the degree of cure in the region 1Y is preferably 70 to 100%.

It is preferable that the minimum melt viscosity of the first connection layer 1 that is measured by a rheometer be higher than that of each of the second connection layer 2 and the third connection layer 3. Specifically, when a value of [the minimum melt viscosity (mPa·s) of the first connection layer 1]/[the minimum melt viscosity (mPa·s) of the second connection layer 2 or the third connection layer 3] is too low, the particle capturing efficiency decreases, and the probability of occurrence of short circuit tends to increase. When the value is too high, the conduction reliability tends to be reduced. Therefore, the value is preferably 1 to 1,000, and more preferably 4 to 400. As to the respective preferable minimum melt viscosities, when the minimum melt viscosity of the first connection layer 1 is too low, the particle capturing efficiency tends to decrease, and when it is too high, the conduction resistance tends to increase. Therefore, it is preferably 100 to 100,000 mPa·s, and more preferably 500 to 50,000 mPa·s. When the minimum melt viscosity of the second or third connection layer 2, 3 is too low, the resin tends to be squeezed out during formation of a reel, and when it is too high, the conduction resistance tends to increase. Therefore, it is preferably 0.1 to 10,000 mPa·s, and more preferably 1 to 1,000 mPa·s.

<Acrylate Compound>

As the acrylate compound used in the insulating resin layer 10 constituting the first connection layer 1, a conventionally known radically polymerizable acrylate can be used. For example, a monofunctional (meth)acrylate (herein, (meth)acrylate includes acrylate and methacrylate), or a polyfunctional (meth)acrylate such as a bifunctional or more (meth)acrylate can be used. In the present invention, it is preferable that a polyfunctional (meth)acrylate be used for at least a portion of an acrylic monomer to form a thermosetting adhesive.

Examples of the monofunctional (meth)acrylate may include methyl (meth)acrylate, ethyl (meth)acrylate, n-propyl (meth)acrylate, i-propyl (meth)acrylate, n-butyl (meth) acrylate, i-butyl (meth)acrylate, tert-butyl (meth) acrylate, 2-methylbutyl (meth) acrylate, n-pentyl (meth)acrylate, n-hexyl (meth)acrylate, n-heptyl (meth)acrylate, 2-methylhexyl (meth)acrylate, 2-ethylhexyl (meth) acrylate, 2-butyl-hexyl (meth) acrylate, isooctyl (meth)acrylate, isopentyl (meth)acrylate, isononyl (meth)acrylate, isodecyl (meth) acrylate, isobornyl (meth)acrylate, cyclohexyl (meth)acrylate, benzyl (meth)acrylate, phenoxy (meth)acrylate, n-nonyl (meth)acrylate, n-decyl (meth)acrylate, lauryl (meth)acrylate, hexadecyl (meth)acrylate, stearyl (meth) acrylate, and morpholin-4-yl (meth)acrylate. Examples of the bifunctional (meth)acrylate may include bisphenol F-EO-modified di(meth)acrylate, bisphenol A-EO-modified di(meth)acrylate, polypropylene glycol di(meth)acrylate, polyethylene glycol (meth) acrylate, tricyclodecane dimethylol di(meth)acrylate, and dicyclopentadiene (meth)acrylate. Examples of a trifunctional (meth)acrylate may include trimethylolpropane tri(meth)acrylate, trimethylolpropane PO-modified (meth)acrylate, and isocyanuric acid EO-modified tri(meth)acrylate. Examples of a tetrafunctional or more (meth)acrylate may include dipentaerythritol penta(meth)acrylate, dipentaerythritol hexa(meth)acrylate, pentaerythritol tetra(meth)acrylate, and di-trimethylolpropane tetraacrylate. In addition, a polyfunctional urethane (meth)acrylate can also be used. Specific examples thereof may include M1100, M1200, M1210, and M1600 (all available from TOAGOSEI CO., LTD.), and AH-600 and AT-600 (all available from KYOEISHA CHEMICAL CO., LTD.).

When the content of the acrylate compound in the insulating resin layer 10 constituting the first connection layer 1 is too small, a difference of minimum melt viscosity between the first connection layer 1 and the second connection layer 2 is unlikely to be produced. When it is too large, curing shrinkage increases, and the workability tends to be reduced. Therefore, the content is preferably 2 to 70% by mass, and more preferably 10 to 50% by mass.

<Photo-Radical Polymerization Initiator>

A photo-radical polymerization initiator may be appropriately selected from known photo-radical polymerization initiators, and used. Examples thereof may include an acetophenone-based photopolymerization initiator, a benzylketal-based photopolymerization initiator, and a phosphorus-based photopolymerization initiator. Specific examples of the acetophenone-based photopolymerization initiator may include 2-hydroxy-2-cyclohexylacetophenone (IRGACURE 184, available from BASF Japan Ltd.), α-hydroxy-α,α'-dimethylacetophenone (DAROCUR 1173, available from BASF Japan Ltd.), 2,2-dimethoxy-2-phenylacetophenone (IRGACURE 651, available from BASF Japan Ltd.), 4-(2-hydroxyethoxy)phenyl (2-hydroxy-2-propyl) ketone (DAROCUR 2959, available from BASF Japan Ltd.), and 2-hydroxy-1-{4-[4-(2-hydroxy-2-methyl-propionyl)-benzyl]phenyl}-2-methyl-1-propan-1-one (IRGACURE 127, available from BASF Japan Ltd.). Examples of the benzylketal-based photopolymerization initiator may include benzophenone, fluorenone, dibenzosuberone, 4-aminobenzophenone, 4,4'-diaminobenzophenone, 4-hydroxybenzophenone, 4-chlorobenzophenone, and 4,4'-dichlorobenzophenone. 2-Benzyl-2-dimethylamino-1-(4-morpholinophenyl)-butanone-1 (IRGACURE 369, available from BASF Japan Ltd.) can also be used. Examples of the phosphorus-based photopolymerization initiator may include bis(2,4,6-trimethylbenzoyl)-phenyl phosphine oxide (IRGACURE 819, available from BASF Japan Ltd.) and 2,4,6-trimethylbenzoyl-diphenyl phosphine oxide (DAROCUR TPO, available from BASF Japan Ltd.).

When the amount of the photoradical polymerization initiator to be used is too small relative to 100 parts by mass of acrylate compound, photo-radical polymerization is unlikely to proceed sufficiently. When it is too large, a decrease in rigidity may be caused. Therefore, it is preferably 0.1 to 25 parts by mass, and more preferably 0.5 to 15 parts by mass.

<Thermal-Radical Polymerization Initiator>

Examples of the thermal-radical polymerization initiator may include an organic peroxide and an azo compound. An organic peroxide can be preferably used since nitrogen that becomes bubbles is not generated.

Examples of the organic peroxide may include methyl ethyl ketone peroxide, cyclohexanone peroxide, methyl cyclohexanone peroxide, acetylacetone peroxide, 1,1-bis(tert-butylperoxy)-3,3,5-trimethyl cyclohexane, 1,1-bis(tert-butylperoxy)cyclohexane, 1,1-bis(tert-hexylperoxy)-3,3,5-trimethyl cyclohexane, 1,1-bis(tert-hexylperoxy) cyclohexane, 1,1-bis(tert-butylperoxy)cyclododecane, isobutyl peroxide, lauroyl peroxide, succinic acid peroxide, 3,5,5-trimethyl hexnoyl peroxide, benzoyl peroxide, octanoyl peroxide, stearoyl peroxide, diisopropyl peroxydicarbonate, dinormal propyl peroxydicarbonate, di-2-ethylhexyl peroxydicarbonate, di-2-ethoxyethyl peroxydicarbonate, di-2-methoxybutyl peroxydicarbonate, bis-(4-tert-butylcyclohexyl)peroxydicarbonate, (α,α-bis-neodecanoylperoxy) diisopropylbenzene, cumyl peroxyneodecanoate, octyl peroxyneodecanoate, hexyl peroxyneodecanoate, tert-butyl peroxyneodecanoate, tert-hexyl peroxypivalate, tert-butyl peroxypivalate, 2,5-dimethyl-2,5-bis(2-ethylhexanoylperoxy)hexane, 1,1,3,3-tetramethylbutylperoxy-2-ethylhexanoate, tert-hexyl peroxy-2-ethylhexanoate, tert-butyl peroxy-2-ethylhexanoate, tert-butyl peroxy-3-methylpropionate, tert-butyl peroxylaurate, tert-butyl peroxy-3,5,5-trimethyl hexanoate, tert-hexylperoxy isopropyl monocarbonate, tert-butylperoxy isopropyl carbonate, 2,5-dimethyl-2,5-bis(benzoylperoxy)hexane, tert-butyl peracetate, tert-hexyl perbenzoate, and tert-butyl perbenzoate. An organic peroxide to which a reductant is added may be used as a redox polymerization initiator.

Examples of the azo compound may include 1,1-azobis (cyclohexane-1-carbonitrile), 2,2'-azobis(2-methyl-butyronitrile), 2,2'-azobisbutyronitrile, 2,2'-azobis(2,4-dimethyl-valeronitrile), 2,2'-azobis(2,4-dimethyl-4-methoxynitrile), 2,2'-azobis(2-amidino-propane) hydrochloride, 2,2'-azobis [2-(5-methyl-2-imidazolin-2-yl)propane] hydrochloride, 2,2'-azobis[2-(2-imidazolin-2-yl)propane] hydrochloride, 2,2'-azobis[2-(5-methyl-2-imidazolin-2-yl)propane], 2,2'-azobis[2-methyl-N-(1,1-bis(2-hydroxymethyl)-2-hydroxyethyl)propionamide], 2,2'-azobis[2-methyl-N-(2-hydroxyethyl)propionamide], 2,2'-azobis(2-methyl-propionamide) dihydrate, 4,4'-azobis(4-cyano-valeric acid), 2,2'-azobis(2-hydroxymethylpropiononitrile), dimethyl 2,2'-azobis(2-methylpropionate), and cyano-2-propyl azoformaide.

When the amount of the thermal-radical polymerization initiator to be used is too small, curing is difficult. When it is too large, the product life is reduced. Therefore, the amount is preferably 2 to 60 parts by mass, and more preferably 5 to 40 parts by mass, relative to 100 parts by mass of the acrylate compound.

<Epoxy Compound>

The insulating resin layer 10 constituting the first connection layer 1 may include a thermal- or photo-cationic or anionic polymerizable resin layer containing an epoxy compound and a thermal- or photo-cationic or anionic polymerization initiator or a layer obtained by subjecting the thermal- or photo-cationic or anionic polymerizable resin layer to thermal- or photo-cationic or anionic polymerization.

Preferred examples of the epoxy compound may include a compound or a resin having two or more epoxy groups in its molecule. These may be liquid or solid. Specific examples thereof may include a glycidyl ether obtained by reacting epichlorohydrin with a polyhydric phenol such as bisphenol A, bisphenol F, bisphenol S, hexahydrobisphenol A, tetramethylbisphenol A, diallylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methane, bixylenol, phenol novolak, and cresol novolak, and a polyglycidyl ether obtained by reacting epichlorohydrin with an aliphatic polyhydric alcohol such as glycerol, neopentyl glycol, ethylene glycol, propylene glycol, butylene glycol, hexylene glycol, polyethylene glycol, and polypropylene glycol; a glycidyl ether ester obtained by reacting epichlorohydrin with a hydroxycarboxylic acid such as p-oxybenzoic acid and β-oxynaphthoic acid, and a polyglycidyl ester obtained from polycarboxylic acid such as phthalic acid, methylphthalic acid, isophthalic acid, terephthalic acid, tetrahydrophthalic acid, hexahydrophthalic acid, endomethylene tetrahydrophthalic acid, endomethylene hexahydrophthalic acid, trimellitic acid, and polymerized fatty acid; a glycidylaminoglycidyl ether obtained from aminophenol and aminoalkylphenol; a glycidylaminoglycidyl ester obtained from aminobenzoic acid; glycidylamine obtained from aniline, toluidine, tribromoaniline, xylylenediamine, diaminocyclohexane, bisaminomethylcyclohexane, 4,4'-diaminodiphenylmethane, and 4,4'-diaminodiphenyl sulfone; and a known epoxy resin such as epoxidized polyolefin. An alicyclic epoxy compound such as 3,4-epoxycyclohexenylmethyl-3',4'-epoxycyclohexene carboxylate can also be used.

<Thermal Cationic Polymerization Initiator>

As the thermal cationic polymerization initiator, a known thermal cationic polymerization initiator for an epoxy compound can be used. For example, the thermal cationic polymerization initiator generates an acid in which a cationically polymerizable compound may be cationically polymerized by heat. A known iodonium salt, sulfonium salt, phosphonium salt, or ferrocene salt can be used. An aromatic sulfonium salt that exhibits favorable latency with respect to temperature can be preferably used. Preferred examples of the thermal cationic polymerization initiator may include diphenyliodonium hexafluoroantimonate, diphenyliodonium hexafluorophosphate, diphenyliodonium hexafluoroborate, triphenylsulfonium hexafluoroantimonate, triphenylsulfonium hexafluorophosphate, and triphenylsulfonium hexafluoroborate. Specific examples thereof may include SP-150, SP-170, CP-66, and CP-77 available from ADEKA CORPORATION; CI-2855 and CI-2639 available from Nippon Soda Co., Ltd.; SAN-AID SI-60 and SI-80 available from SANSHIN CHEMICAL INDUSTRY CO., LTD.; and CYRACURE-UVI-6990 and UVI-6974 available from Union Carbide Corporation.

When the amount of the thermal cationic polymerization initiator to be added is too small, thermal cationic polymerization is unlikely to proceed sufficiently. When it is too large, a decrease in rigidity may be caused. Therefore, the amount is preferably 0.1 to 25 parts by mass, and more preferably 0.5 to 15 parts by mass, relative to 100 parts by mass of the epoxy compound.

<Thermal Anionic Polymerization Initiator>

As the thermal anionic polymerization initiator, a known thermal anionic polymerization initiator for an epoxy compound can be used. For example, the thermal anionic polymerization initiator generates a base in which an anionically polymerizable compound may be anionically polymerized by heat. A known aliphatic amine compound, aromatic amine compound, secondary or tertiary amine compound, imidazole compound, polymercaptan compound, boron trifluoride-amine complex, dicyandiamide, or organic acid hydrazide can be used. An encapsulated imidazole compound that exhibits favorable latency with respect to temperature can be preferably used. Specific examples thereof may include NOVACURE HX3941HP available from Asahi Kasei E-materials Corporation.

When the amount of the thermal anionic polymerization initiator to be added is too small, curing tends to be difficult. When it is too large, the product life tends to be reduced. Therefore, the amount is preferably 2 to 60 parts by mass, and more preferably 5 to 40 parts by mass, relative to 100 parts by mass of the epoxy compound.

<Photo-Cationic Polymerization Initiator and Photo-Anionic Polymerization Initiator>

As the photo-cationic polymerization initiator or the photo-anionic polymerization initiator for the epoxy compound, a known polymerization initiator can appropriately be used.

<Conductive Particles>

The conductive particles 4 constituting the first connection layer 1 can be appropriately selected from particles used in a conventionally known anisotropic conductive film, and used. Examples thereof may include particles of metal such as nickel, cobalt, silver, copper, gold, and palladium, and metal-coated resin particles. Two or more kinds thereof may be used in combination.

When the average particle diameter of the conductive particles 4 is too small, the particles cannot correspond to various heights of wirings, and conduction resistance tends to increase. When it is too large, short circuit tends to occur. Therefore, it is preferably 1 to 10 μm, and more preferably 2 to 6 μm. The average particle diameter can be measured by a general particle size distribution measurement device.

When the amount of such conductive particles 4 in the first connection layer 1 is too small, the particle capturing efficiency decreases, and anisotropic conductive connection is difficult. When it is too large, short circuit may be caused. Therefore, it is preferably 50 to 40,000, and more preferably 200 to 20,000 per square millimeter.

<Other Components in First Connection Layer>

In the first connection layer 1, if necessary, a film-forming resin such as a phenoxy resin, an epoxy resin, an unsaturated polyester resin, a saturated polyester resin, a urethane resin, a butadiene resin, a polyimide resin, a polyamide resin, and a polyolefin resin can be used in combination.

When the insulating resin layer 10 constituting the first connection layer 1 is a layer obtained by photo-radical polymerization of a photo-radical polymerizable resin layer containing an acrylate compound and a photo-radical polymerization initiator, it is preferable that the insulating resin layer 10 further contain an epoxy compound and a thermal cationic polymerization initiator. In this case, it is preferable that the second connection layer 2 and the third connection layer 3 be also a thermal-cationic polymerizable resin layer containing the epoxy compound and the thermal cationic polymerization initiator, as described below. Thus, the interlayer peel strength can be improved.

In the first connection layer 1, it is preferable that the conductive particles 4 dig into the second connection layer 2 (i.e., the conductive particles 4 be exposed on the surface of the first connection layer 1), as shown in FIG. 1A. When all the conductive particles 4 are embedded in the first connection layer 1, the connection resistance may be reduced due to insufficient exclusion of the insulating resin layer 10. When the degree of digging is too small, the particle capturing efficiency tends to decrease. When it is too large, the connection resistance tends to increase. Therefore, it is preferably 10 to 90%, and more preferably 20 to 80% of the average particle diameter of the conductive particles 4.

The first connection layer 1 can be formed by disposing the conductive particles 4 within the openings of the die with the openings, placing the insulating resin layer 10 that forms the first connection layer 1 formed on a release film so as to be opposed to a surface of the die with the openings 21, and applying pressure while heating if necessary, so that the insulating resin does not enter into a corner of bottom of the openings.

<Second Connection Layer and Third Connection Layer>

The second connection layer 2 and the third connection layer 3 are both formed mainly of an insulating resin. The insulating resin may be appropriately selected from known insulating resins, and used. They can be formed from a material that is the same as the material for the insulating resin layer 10 in the first connection layer 1.

The second connection layer 2 is disposed on a side of the conductive particles 4 in the first connection layer 1, and is usually a layer disposed on a side of a terminal that requires high accuracy of position alignment, such as a bump of an IC chip. On the other hand, the third connection layer 3 is usually disposed on a side of a terminal that does not require relatively high accuracy of alignment, such as a solid electrode of a glass substrate.

When the thickness of the second connection layer 2 is too small, the filled resin is insufficient, and therefore the conduction failure may occur. When it is too large, the resin is squeezed out during compression bonding, and a compression-bonding device may be contaminated. Therefore, it is preferably 5 to 20 μm, and more preferably 8 to 15 μm. When the thickness of the third connection layer 3 is too small, the third connection layer 3 may be insufficiently adhered to a second electronic component during temporary application. When it is too large, the conduction resistance tends to increase. Therefore, it is preferably 0.5 to 6 μm, and more preferably 1 to 5 μm.

<Method of Producing Anisotropic Conductive Film>

Next, a method of producing the anisotropic conductive film of the present invention will be described as one example. This production method includes the following steps (A) to (D). Hereinafter, each step will be described.

<Step (A)>

Figure 2A:
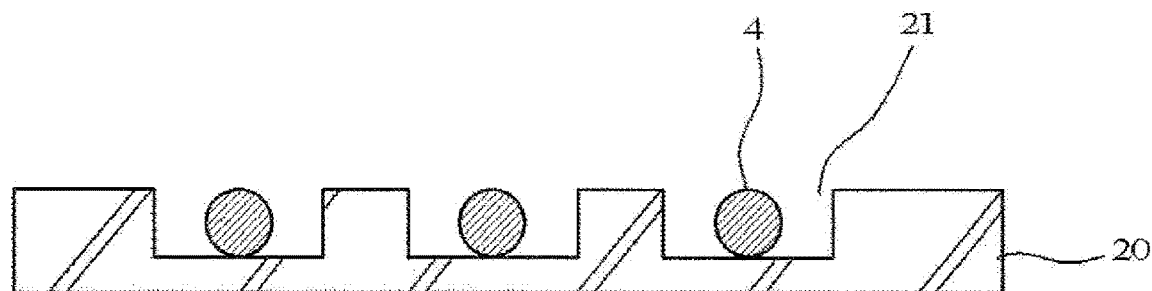
FIG. 2A is a diagram illustrating step (A) of producing the anisotropic conductive film of the present invention.
Figure 2B:
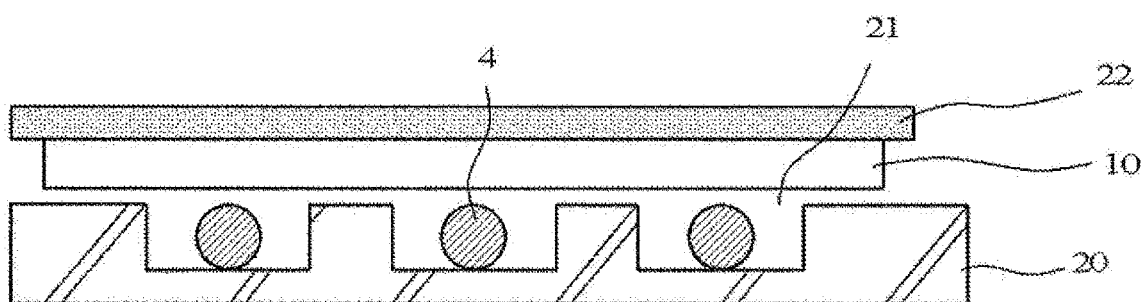
FIG. 2B is a diagram illustrating step (A) of producing the anisotropic conductive film of the present invention.

As shown in FIG. 2A, the conductive particles 4 are disposed within openings 21 of a transfer die 20 with the openings 21, and as shown in FIG. 2B, the insulating resin layer 10 formed on a release film 22 is disposed so as to be opposed to a surface of the transfer die 20 with the openings 21.

The transfer die 20 has openings that are formed, for example, from an inorganic material such as various ceramics, glass, and metal including stainless steel, or an organic material such as various resins, by a known opening-forming method such as a photolithography method. Such a transfer die 20 may have a shape of a plate, a roller, or the like.

The openings 21 of the transfer die 20 house the conductive particles 4 thereinside. The openings 21 may have a shape of column, polygonal pillar such as square pillar, or pyramid such as square pyramid.

It is preferable that the alignment of the openings 21 be regular alignment such as a lattice pattern and a zigzag pattern.

The diameter and the depth of the openings 21 of the transfer die 20 can be measured by a laser microscope.

A method for housing the conductive particles 4 in the openings 21 of the transfer die 20 is not particularly limited, and a known procedure can be utilized. For example, a dried powder of conductive particles or a dispersion liquid in which the powder is dispersed in a solvent is sprayed or applied to an opening-forming face of the transfer die 20, and the surface of the opening-forming face may be wiped with a brush, a blade, or the like.

The ratio of the average particle diameter of the conductive particles 4 to the depth of the openings 21 (the average particle diameter of the conductive particles/the depth of the openings) is preferably 0.4 to 3.0, and more preferably 0.5 to 1.5 in terms of balance between improvement of transfer and conductive particle retentivity.

The ratio of the average particle diameter of the conductive particles 4 to the diameter of the openings 21 (the average particle diameter of the conductive particles/the diameter of the opening) is preferably 1.1 to 2.0, and more preferably 1.3 to 1.8 in terms of balance between easy housing of the conductive particles, easy pressing of the insulating resin, and the like.

When the bottom diameter of the openings 21 is smaller than the opening diameter of the openings 21, it is preferable that the bottom diameter be 1.1 times or more and less than 2 times the diameter of the conductive particles and the opening diameter be 1.3 times or more and less than 3 times the diameter of the conductive particles.

<Step (B)>

Figure 3A:
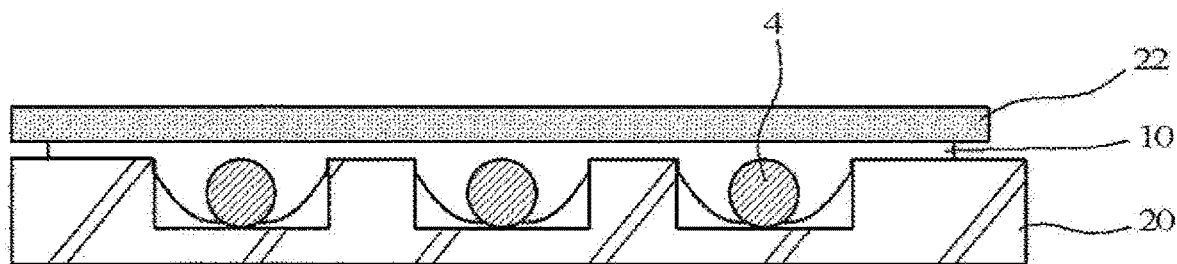
FIG. 3A is a diagram illustrating step (B) of producing the anisotropic conductive film of the present invention.
Figure 3B:
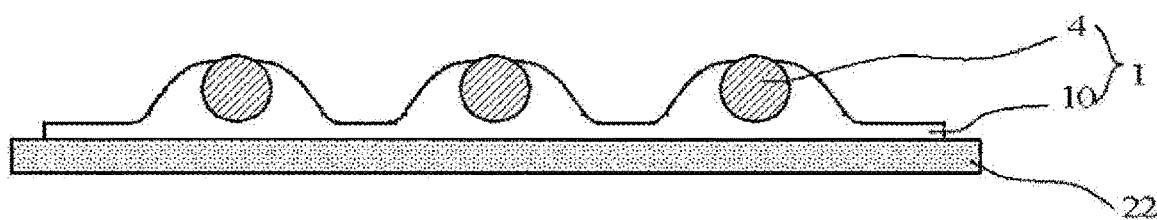
FIG. 3B is a diagram illustrating step (B) of producing the anisotropic conductive film of the present invention.

As shown in FIG. 3A, pressure is applied to the insulating resin layer 10 from a side of the release film 22 to press the insulating resin into the openings 21, and the conductive particles 4 are transferred to a surface of the insulating resin layer 10 so as to be embedded. Thus, the first connection layer 1 having a structure in which the conductive particles 4 are arranged in a single layer in the plane direction of the insulating resin layer 10, as shown in FIG. 3B, is formed. In the first connection layer 1, the thickness of the insulating resin layer in central regions between adjacent ones of the conductive particles 4 is smaller than the thickness of the insulating resin layer in regions in proximity to the conductive particles. In this case, the thickness of the insulating resin layer between the adjacent ones of the conductive particles 4 may be substantially zero (see FIG. 1C). When it is substantially zero, independence of each conductive particle after connection is enhanced, and linkage of the conductive particles during connection is easily prevented.

<Step (C)>

Figure 4:
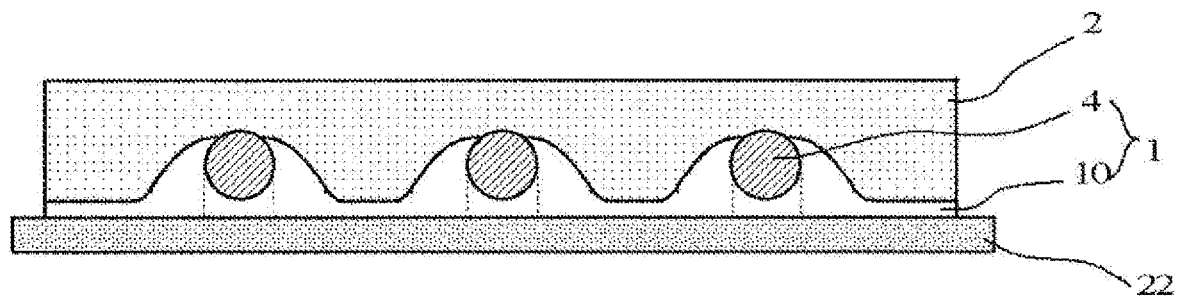
FIG. 4 is a diagram illustrating step (C) of producing the anisotropic conductive film of the present invention.

As shown in FIG. 4, the second connection layer 2 formed mainly of an insulating resin is formed on a surface of the first connection layer 1 on a side of the conductive particles 4. Thus, a boundary between the first connection layer and the second connection layer has an undulating shape, that is, a wave shape or an irregular shape. When a layer in the film has an undulating shape, as described above, a possibility of increasing a contact area mainly with a bump during jointing can be increased. Therefore, the adhesion strength can be expected to be improved.

<Step (D)>

Figure 5:
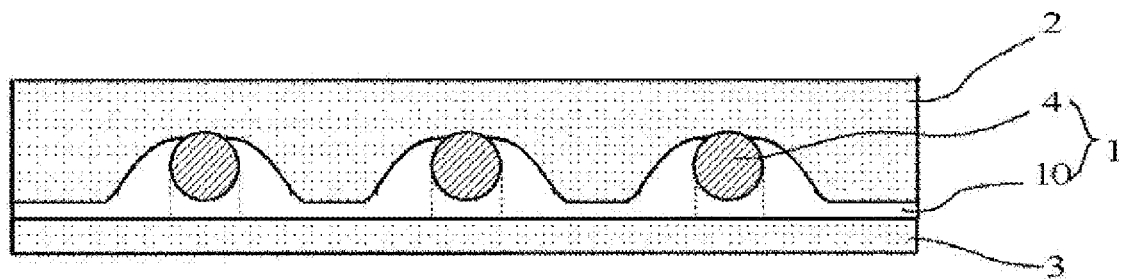
FIG. 5 is a diagram illustrating step (D) of producing the anisotropic conductive film of the present invention.

Subsequently, after the release film 22 is removed, the third connection layer 3 formed mainly of an insulating resin is formed on a surface of the first connection layer 1 on a side opposite to the second connection layer 2. Thus, the anisotropic conductive film 100 shown in FIG. 5 is obtained.

Figure 3C:
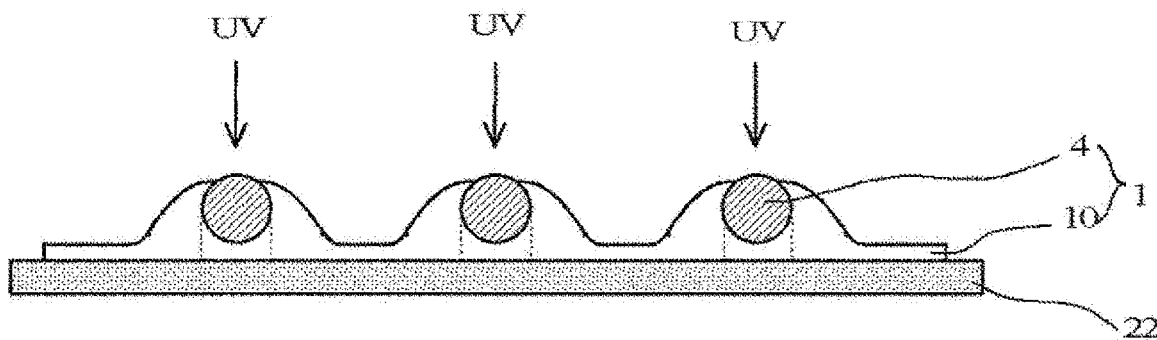
FIG. 3C is a diagram illustrating a step (B) of producing the anisotropic conductive film of the present invention.

It is preferable that the first connection layer 1 be irradiated with ultraviolet rays UV from the side of the conductive particles 4 as shown in FIG. 3C between the steps (B) and (C). Thus, the conductive particles 4 can be fixed on the first connection layer 1. In addition, the degree of cure of the first connection layer 1 below the conductive particles 4 can be made relatively lower as compared with a periphery thereof, and the pressing property of the conductive particles during anisotropic conductive connection can be improved.

«Method of Producing Anisotropic Conductive Film»

An example of another method of producing the anisotropic conductive film of the present invention will be described. This method is an aspect in which the third connection layer 3 is used instead of the release film 22 and includes the following steps (a) to (c). Hereinafter, each step will be described.

<Step (a)>

Figure 6A:
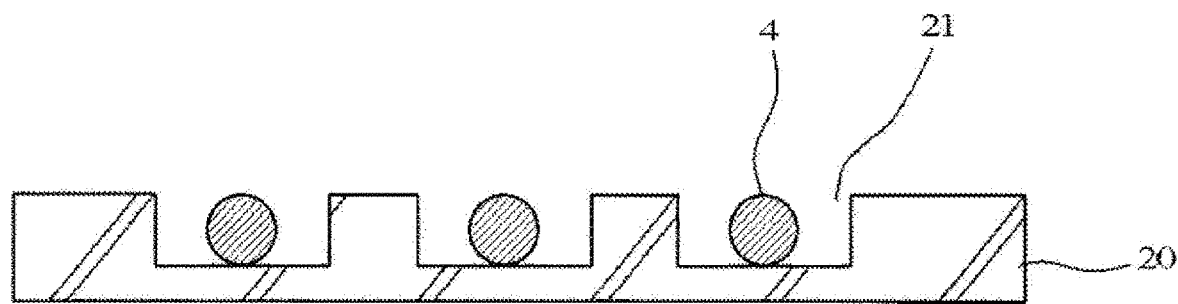
FIG. 6A is a diagram illustrating step (a) of producing the anisotropic conductive film of the present invention.
Figure 6B:
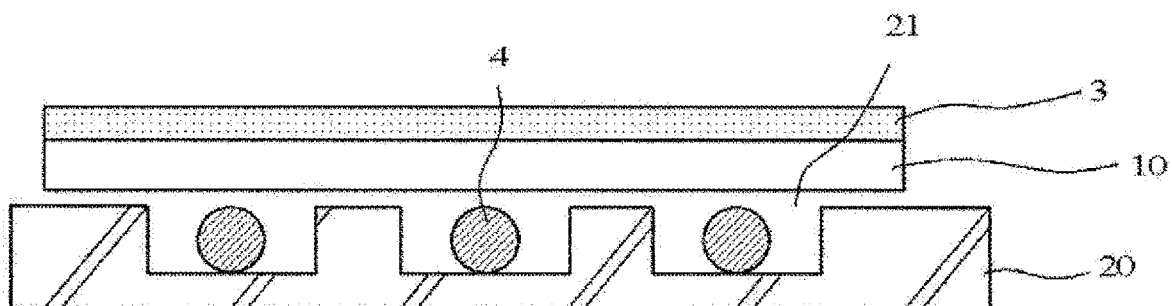
FIG. 6B is a diagram illustrating step (a) of producing the anisotropic conductive film of the present invention.

As shown in FIG. 6A, the conductive particles 4 are disposed within openings 21 of a transfer die 20 with the openings 21, and as shown in FIG. 6B, and the insulating resin layer 10 that has been bonded to the third connection layer 3 in advance is placed so as to be opposed to a surface of the transfer die 20 with the openings 21.

<Step (b)>

Figure 7A:
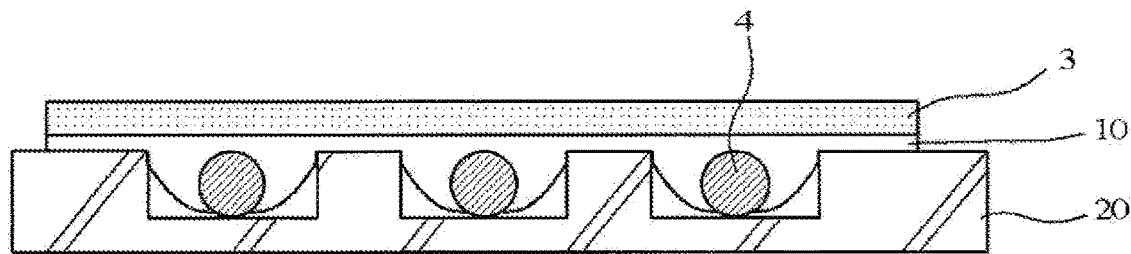
FIG. 7A is a diagram illustrating step (b) of producing the anisotropic conductive film of the present invention.
Figure 7B:
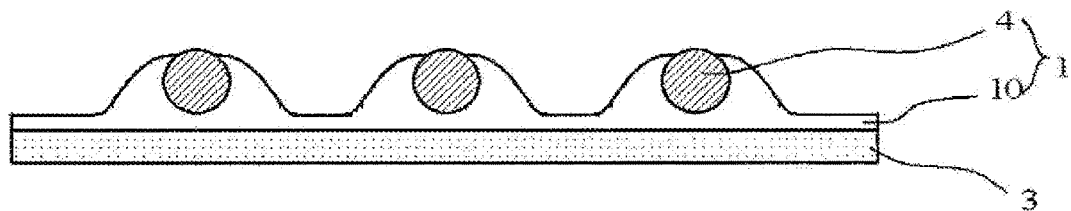
FIG. 7B is a diagram illustrating step (b) of producing the anisotropic conductive film of the present invention.

As shown in FIG. 7A, pressure is applied to the insulating resin layer 10 from a side of the third connection layer 3 to press the insulating resin into the openings 21, and the conductive particles 4 are thereby transferred to a surface of the insulating resin layer 10. Thus, the first connection layer 1 having a structure in which the conductive particles 4 are arranged in a single layer in the plane direction of the insulating resin layer 10, as shown in FIG. 7B, is formed. In the first connection layer 1, the thickness of the insulating resin layer in central regions between adjacent ones of the conductive particles 4 is smaller than the thickness of the insulating resin layer in regions in proximity to the conductive particles. In this case, the thickness of the insulating resin layer between the adjacent ones of the conductive particles 4 may be substantially zero (see FIG. 1C). When it is substantially zero, independence of each conductive particle after connection is enhanced, and linkage of the conductive particles during connection is easily prevented.

<Step (c)>

The second connection layer 2 formed mainly of an insulating resin is formed on a surface of the first connection layer 1 on a side of the conductive particles 4. Thus, the anisotropic conductive film 100 shown in FIG. 8 is obtained.

Figure 7C:
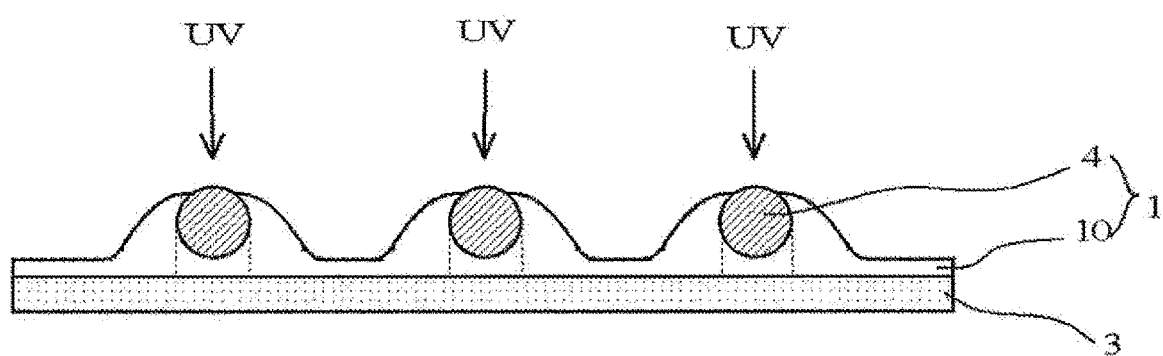
FIG. 7C is a diagram illustrating step (b) of producing the anisotropic conductive film of the present invention.

It is preferable that the first connection layer 1 be irradiated with ultraviolet rays UV from the side of the conductive particles 4 as shown in FIG. 7C between the steps (b) and (c). Thus, the conductive particles 4 can be fixed on the first connection layer 1. In addition, the degree of cure of the first connection layer 1 below the conductive particles 4 can be made relatively lower as compared with a periphery thereof, and the pressing property of the conductive particles during anisotropic conductive connection can be improved.

Figure 8:
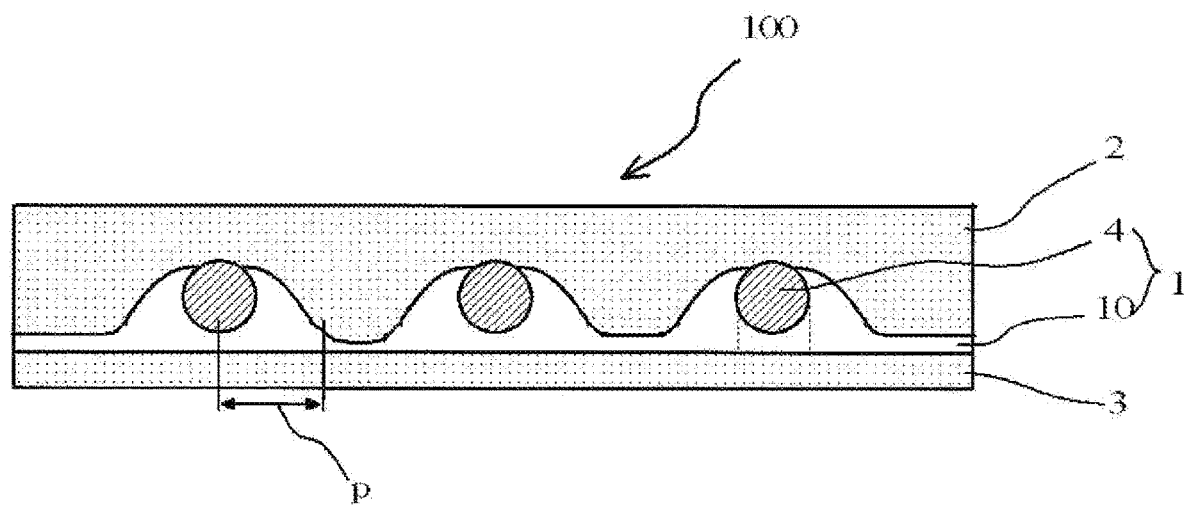
FIG. 8 is a diagram illustrating step (c) of producing the anisotropic conductive film of the present invention.

In the anisotropic conductive film shown in FIG. 8, the first connection layer 1 mainly includes the conductive particles 4. In this case, a region where each of the conductive particles is encompassed by the first connection layer 1 has a convex shape on a side of the second connection layer 2. Therefore, the width of the region on the third connection layer 3 side is larger than that on the second connection layer 2 side. The shortest distance p in a horizontal direction between an end in the thickness direction of the conductive particles 4 on a side of larger width (bottom end of the particles) and the second connection layer 2 contributes to stability of the conductive particles during connection. Specifically, p acts as a base of a fixed portion. Therefore, the convex shape of the resin in regions in proximity to the conductive particles means that the particles encompassed by the resin remain and are isolated. This is because a probability of relatively suppressing the fluidity of the conductive particles in the plane direction is increased by a skirt portion of the first connection layer that encompasses the conductive particles during compression of the conductive particles by pressing. This effect is substantially the same even when the thickness of the first connection layer in the central region between the conductive particles is zero, as described above. This is because the fluidity of the particles is suppressed by the shape of the resin in regions in proximity to the particles, as described above, and whether the end thereof is closed or slightly opened is not essentially different. Therefore, an effect of preventing linkage between the conductive particles can be expected to be expressed as substantially the same result. Accordingly, p represents a corresponding length to the skirt portion of the convex shape, that is, a length that can be expected to have an operation effect. In this case, the shortest distance p in the horizontal direction between the end in the thickness direction of the conductive particles and the second connection layer 2 is preferably 0.5 to 1.5 times, and more preferably 0.55 to 1.25 times the diameter of the conductive particles.

«Application of Anisotropic Conductive Film»

The anisotropic conductive film obtained above can be preferably applied to anisotropic conductive connection by heat or light between a first electronic component such as an IC chip and an IC module and a second electronic component such as a flexible substrate and a glass substrate. The resultant connection structure is also a part of the present invention. In this case, it is preferable that the anisotropic conductive film be temporarily applied to the second electronic component from the third connection layer side, the first electronic component such as an IC chip be mounted on the anisotropic conductive film temporarily applied, and the anisotropic conductive film be subjected to thermocompression-bonding from the first electronic component side since the connection reliability is enhanced. Further, light curing can also be used for connection.

EXAMPLES

Hereinafter, the present invention will be described specifically by way of Examples.

Examples 1 to 10

An acrylate, a photo-radical polymerization initiator, and the like were mixed in accordance with a composition described in Table 1 or 2 to prepare a mixed liquid so that the solid content in ethyl acetate or toluene was 50% by mass. This mixed liquid was applied to a polyethylene terephthalate film (PET film) with a thickness of 50 μm so as to have a dried thickness of 5 μm, and dried in an oven at 80° C. for 5 minutes, to form a photoradically polymerizable insulating resin layer as a first connection layer.

A stainless steel transfer die with columnar openings that had a diameter of 5.5 μm and a depth of 4.5 μm and were provided at longitudinal and horizontal pitches of 9 μm was prepared. Each opening housed each of conductive particles with an average particle diameter of 4 μm (Ni/Au plated resin particles, AUL 704, available from SEKISUI CHEMICAL CO., LTD.). An insulating resin layer for a first connection layer was placed so as to be opposite to an opening-forming face of the transfer die. The conductive particles were pressed into the insulating resin layer by applying pressure under conditions of 60° C. and 0.5 MPa from a side of a release film. Thus, the insulating resin layer was formed so that the thickness of the insulating resin layer in central regions between adjacent ones of the conductive particles was smaller than the thickness of the insulating resin layer in regions in proximity to the conductive particles.

Subsequently, the photo-radical polymerizable insulating resin layer was irradiated with ultraviolet rays with a wavelength of 365 nm and an integrated light quantity of 4,000 mL/cm² from the conductive particle side. Thus, the first connection layer, on the surface of which the conductive particles were fixed, was formed.

A thermosetting resin, a latent curing agent, and the like were mixed in ethyl acetate or toluene to prepare a mixed liquid so that the solid content was 50% by mass. This mixed liquid was applied to a PET film with a thickness of 50 μm so as to have a dried thickness of 12 μm, and dried in an oven at 80° C. for 5 minutes, to form a second connection layer. A third connection layer with a dried thickness of 3 μm was formed by the same operation.

The second connection layer was laminated on the obtained first connection layer under conditions of 60° C. and 0.5 MPa so that the conductive particles were located inside, and the third connection layer was similarly laminated on the opposite surface to obtain an anisotropic conductive film.

In Examples 7 to 10, an anisotropic conductive film was formed so that the thickness of the first connection layer between the conductive particles was substantially zero. Specifically, an anisotropic conductive film was formed in the same manner as in Example 1 except that an insulating resin layer for a first connection layer was placed so as to be opposed, and pressurized from the release film side under conditions of 60° C. and 0.5 MPa, followed by pressurization again under conditions of 60° C. and 1.0 MPa.

Comparative Example 1

A photo-radical polymerizable insulating resin layer that was a precursor layer of a first connection layer, similarly to Example 1, was formed in accordance with a composition described in Table 1.

A stainless steel transfer die with columnar openings that had a diameter of 5.5 μm and a depth of 4.5 μm and were provided at longitudinal and horizontal pitches of 9 μm was prepared. Each opening housed each of conductive particles with an average particle diameter of 4 μm (Ni/Au plated resin particles, AUL 704, available from SEKISUI CHEMICAL CO., LTD.). An insulating resin layer for a first connection layer was placed so as to be opposed to an opening-forming face of the transfer die. The conductive particles were transferred to a surface of the insulating resin layer by applying pressure under relatively weak conditions of 40° C. and 0.1 MPa from the release film side. This film having transferred conductive particles was taken out, and the conductive particles were completely pressed into the insulating resin layer so that the surface of the resin layer was flat.

Subsequently, the photo-radical polymerizable insulating resin layer in which the conductive particles were embedded was irradiated with ultraviolet rays with a wavelength of 365 nm and an integrated light quantity of 4,000 mL/cm². Thus, a flat first connection layer was formed.

A second connection layer with a thickness of 12 μm and a third connection layer with a thickness of 3 μm that were formed in the same manner as in Example 1 were laminated on the first connection layer to form an anisotropic conductive film.

Comparative Example 2

From a mixture in which conductive particles that were the same as in Example 1 were uniformly dispersed in a resin composition for a first connection layer of Table 1 so that the number was 20,000 per square millimeter, a conductive particle-containing resin film with a thickness of 6 μm was formed. To this film, a second connection layer with a thickness of 12 μm formed in the same manner as in Example 1 was bonded under conditions of 60° C. and 0.5 MPa, to form an anisotropic conductive film having a two-layer structure.

<Evaluation>

A case where a uniform planar arrangement between the conductive particles in the obtained anisotropic conductive films is formed is evaluated as applicable (Yes), and another case is evaluated as not applicable (No). A case where the thickness of the insulating resin layer in regions in proximity to the conductive particles is larger than that of the insulating resin layer in central regions between the conductive particles (also including a thickness of 0) is evaluated as an increase in the thickness of the insulating resin layer in regions in proximity to the conductive particles (Yes), and another case is evaluated as no increase (No). The results are shown in Tables 1 and 2. The number of layers constituting each of the anisotropic conductive films is also shown.

An IC chip with a size of 0.5 mm×1.8 mm×20.0 mm (bump size: 30 μm×85 μm, bump height: 15 μm, bump pitch: 50 μm) was mounted on a glass circuit board (1737F) with a size of 0.5 mm×50 mm×30 mm available from Corning Incorporated using each of the obtained anisotropic conductive films under conditions of 180° C., 80 MPa, and 5 seconds to obtain a connection structure sample. When the cross section of a connection part of the connection structure sample was observed by an electron microscope, the insulating resin layer around the conductive particles was confirmed, as shown in FIG. 1A.

As described below, "minimum melt viscosity," "particle capturing efficiency," "conduction reliability," and "insulating properties" in the obtained connection structure sample were evaluated on a test. The results are shown in Tables 1 and 2.

"Minimum Melt Viscosity"

The minimum melt viscosity of each of the first connection layer and the second connection layer that constituted the connection structure sample was measured by a rotational rheometer (manufactured by TA Instruments) under conditions of a temperature increasing rate of 10° C./min, a constant measurement pressure of 5 g, and a measurement plate diameter of 8 mm.

"Particle Capturing Efficiency"

The ratio of the "amount of particles actually captured on bumps of the connection structure sample after heating and pressurization (after actual mounting)" to the "theoretical amount of particles existing on bumps of the connection structure sample before heating and pressurization" was determined in accordance with the following mathematical expression. In practical terms, the ratio is desirably 50% or more.

Particle capturing efficiency (%)={[number of particles on bumps after heating and pressurization]/[number of particles on bumps before heating and pressurization]}×100

"Conduction Reliability"

The connection structure sample was left under an environment of a high temperature of 85° C. and a high humidity of 85% RH. The conduction resistances at the initial stage and after 500 hours were measured. In practical terms, the resistance is desirably 10Ω or less even after 500 hours.

"Insulating Properties"

The rate of occurrence of a short circuit in a comb-teeth TEG pattern with a space of 7.5 μm was determined. In practical terms, the ratio is desirably 100 ppm or less.

TABLE 1

| | | | | Example | | | |
|---|---|---|---|---|---|---|---|
| | | | | 1 | 2 | 3 | 4 |
| Application of Uniform Planar Arrangement of Conductive Particles | | | | Yes | Yes | Yes | Yes |
| Increase in Thickness of Insulating Resin Layer in Regions in proximity to Conductive Particles | | | | Yes | Yes | Yes | Yes |
| Number of Layers Constituting Anisotropic Conductive Film | | | | 3 | 3 | 3 | 3 |
| First Connection Layer | Phenoxy Resin (Parts By Mass) | YP-50 | Nippon Steel & Sumikin Chemical Co., Ltd. | 60 | 60 | 60 | 60 |
| | Acrylate (Parts By Mass) | EB600 | Daicel-Allnex Ltd. | 40 | 40 | | |
| | Photo-Radical Polymerization Initiator (Parts By Mass) | IRGACURE 369 | BASF Japan Ltd. | 2 | 2 | | |
| | Epoxy Resin (Parts By Mass) | jER828 | Mitsubishi Chemical Corporation | | | 40 | 40 |
| | Thermal Cationic Polymerization Initiator (Parts By Mass) | SI-60L | Sanshin Chemical Industry Co., Ltd. | | | 2 | 2 |
| Minimum Melt Viscosity of First Connection Layer | [mPa · s] After UV Irradiation for Examples 1 and 2 | | | 20000 | 20000 | 20000 | 20000 |
| Second Connection Layer | Phenoxy Resin (Parts By Mass) | YP-50 | Nippon Steel & Sumikin Chemical Co., Ltd. | 60 | 60 | 60 | 60 |
| | Epoxy Resin (Parts By Mass) | jER828 | Mitsubishi Chemical Corporation | 40 | | 40 | |
| | Thermal Cationic Polymerization Initiator (Parts By Mass) | SI-60L | Sanshin Chemical Industry Co., Ltd. | 2 | | 2 | |
| | Acrylate (Parts By Mass) | EB600 | Daicel-Allnex Ltd. | | 40 | | 40 |
| | Organic Peroxide (Parts By Mass) | Perhexyl Z | NOF Corporation | | 2 | | 2 |
| Minimum Melt Viscosity of Second Connection Layer | [mPa · s] | | | 500 | 500 | 500 | 500 |
| Third Connection Layer | Phenoxy Resin (Parts By Mass) | YP-50 | Nippon Steel & Sumikin Chemical Co., Ltd.. | 60 | 60 | 60 | 60 |
| | Epoxy Resin (Parts By Mass) | jER828 | Mitsubishi Chemical Corporation | 40 | | 40 | |
| | Thermal Cationic Polymerization Initiator (Parts By Mass) | SI-60L | Sanshin Chemical Industry Co., Ltd. | 2 | | 2 | |
| | Acrylate (Parts By Mass) | EB606 | Daicel-Allnex Ltd.. | | 40 | | 40 |
| | Organic Peroxide (Parts By Mass) | Perhexyl Z | NOF Corporation | | 2 | | 2 |
| Minimum Melt Viscosity of Third Connection Layer | [mPa · s] | | | 500 | 500 | 500 | 500 |
| [Minimum Melt Viscosity of First Connection Layer]/[Minimum Melt Viscosity of Second or Third Connection Layer] | | | | 40 | 40 | 40 | 40 |
| Conduction Resistance Value (Ω) | | | Initial | 0.2 | 0.2 | 0.2 | 0.2 |
| | | | 85° C., 85% RH, 500 hr | 5.0 | 6.0 | 8.0 | 7.6 |

TABLE 1-continued

| | | | | | | |
|---|---|---|---|---|---|---|
| Insulating Properties (Rate of Occurrence of Short Circuit) | [ppm] | | | 30 | 30 | 30 | 30 |
| Particle Capturing Efficiency | [%] | | | 82.40 | 79.20 | 80.40 | 83.10 |

| | | | | Example | | Comparative Example | |
|---|---|---|---|---|---|---|---|
| | | | | 5 | 6 | 1 | 2 |
| Application of Uniform Planar Arrangement of Conductive Particles | | | | Yes | Yes | Yes | No |
| Increase in Thickness of Insulating Resin Layer in Regions in proximity to Conductive Particles | | | | Yes | Yes | No | No |
| Number of Layers Constituting Anisotropic Conductive Film | | | | 3 | 3 | 3 | 2 |
| First Connection Layer | Phenoxy Resin (Parts By Mass) | YP-50 | Nippon Steel & Sumikin Chemical Co., Ltd. | 80 | 40 | 60 | 60 |
| | Acrylate (Parts By Mass) | EB600 | Daicel-Allnex Ltd. | 20 | 60 | 40 | 40 |
| | Photo-Radical Polymerization Initiator (Parts By Mass) | IRGACURE 369 | BASF Japan Ltd. | 2 | 2 | 2 | 2 |
| | Epoxy Resin (Parts By Mass) | jER828 | Mitsubishi Chemical Corporation | | | | |
| | Thermal Cationic Polymerization Initiator (Parts By Mass) | SI-60L | Sanshin Chemical Industry Co., Ltd. | | | | |
| Minimum Melt Viscosity of First Connection Layer | [mPa · s] After UV Irradiation for Examples 1 and 2 | | | 2000 | 100000 | 20000 | 20000 |
| Second Connection Layer | Phenoxy Resin (Parts By Mass) | YP-50 | Nippon Steel & Sumikin Chemical Co., Ltd. | 60 | 80 | 60 | 60 |
| | Epoxy Resin (Parts By Mass) | jER828 | Mitsubishi Chemical Corporation | 40 | 20 | 40 | 40 |
| | Thermal Cationic Polymerization Initiator (Parts By Mass) | SI-60L | Sanshin Chemical Industry Co., Ltd. | 2 | 2 | 2 | 2 |
| | Acrylate (Parts By Mass) | EB600 | Daicel-Allnex Ltd. | | | | |
| | Organic Peroxide (Parts By Mass) | Perhexyl Z | NOF Corporation | | | | |
| Minimum Melt Viscosity of Second Connection Layer | [mPa · s] | | | 500 | 250 | 500 | 500 |
| Third Connection Layer | Phenoxy Resin (Parts By Mass) | YP-50 | Nippon Steel & Sumikin Chemical Co., Ltd.. | 60 | 60 | 60 | |
| | Epoxy Resin (Parts By Mass) | jER828 | Mitsubishi Chemical Corporation | 40 | 40 | 40 | |
| | Thermal Catbnic Polymerization Initiator (Parts By Mass) | SI-60L | Sanshin Chemical Industry Co., Ltd. | 2 | 2 | 2 | |
| | Acrylate (Parts By Mass) | EB606 | Daicel-Allnex Ltd.. | | | | |
| | Organic Peroxide (Parts By Mass) | Perhexyl Z | NOF Corporation | | | | |
| Minimum Melt Viscosity of Third Connection Layer | [mPa · s] | | | 500 | 250 | 500 | — |
| [Minimum Melt Viscosity of First Connection Layer]/ [Minimum Melt Viscosity of Second or Third Connection Layer] | | | | 4 | 400 | 40 | 40 |
| Conduction Resistance Value (Ω) | Initial | | | 0.2 | 0.2 | 2.0 | 0.2 |
| | 85° C., 85% RH, 500 hr | | | 5.0 | 8.0 | 50.0 | 5.0 |
| Insulating Properties (Rate of Occurrence of Short Circuit) | [ppm] | | | 100 | 10 | 30 | 3000 |
| Particle Capturing Efficiency | [%] | | | 43.60 | 84.95 | 63.70 | 25 |

45

TABLE 2

| | | | | Example | | | |
|---|---|---|---|---|---|---|---|
| | | | | 7 | 8 | 9 | 10 |
| Application of Uniform Planar Arrangement of Conductive Particles | | | | Yes | Yes | Yes | Yes |
| Increase in Thickness of Insulating Resin Layer in Regions in proximity to Conductive Particles | | | | Yes | Yes | Yes | Yes |
| Number of Layers Constituting Anisotropic Conductive Film | | | | 3 | 3 | 3 | 3 |
| First Connection Layer | Phenoxy Resin (Parts By Mass) | YP-50 | Nippon Steel & Sumikin Chemical Co., Ltd. | 60 | 60 | 60 | 60 |
| | Acrylate (Parts By Mass) | EB600 | Daicel-Allnex Ltd. | 40 | 40 | | |
| | Photo-Radical Polymerization Initiator (Parts By Mass) | IRGACURE 369 | BASF Japan Ltd. | 2 | 2 | | |
| | Epoxy Resin (Parts By Mass) | jER828 | Mitsubishi Chemical Corporation | | | 40 | 40 |
| | Thermal Cationic Polymerization Initiator (Parts By Mass) | SI-60L | Sanshin Chemical Industry Co., Ltd. | | | 2 | 2 |
| Minimum Melt Viscosity of First Connection Layer | [mPa · s] | | | 20000 | 20000 | 20000 | 20000 |
| Second Connection Layer | Phenoxy Resin (Parts By Mass) | YP-50 | Nippon Steel & Sumikin Chemical Co., Ltd. | 60 | 60 | 60 | 60 |

TABLE 2-continued

|  |  |  |  | Example 7 | Example 8 | Example 9 | Example 10 |
|---|---|---|---|---|---|---|---|
|  | Epoxy Resin (Parts By Mass) | jER828 | Mitsubishi Chemical Corporation | 40 |  | 40 |  |
|  | Thermal Cationic Polymerization Initiator (Parts By Mass) | SI-60L | Sanshin Chemical Industry Co., Ltd. | 2 |  | 2 |  |
|  | Acrylate (Parts By Mass) | EB600 | Daicel-Allnex Ltd. |  | 40 |  | 40 |
|  | Organic Peroxide (Parts By Mass) | Perhexyl Z | NOF Corporation |  | 2 |  | 2 |
| Minimum Melt Viscosity of Second Connection Layer | | [mPa · s] | | 500 | 500 | 500 | 500 |
| Third Connection Layer | Phenoxy Resin (Parts By Mass) | YP-50 | Nippon Steel & Sumikin Chemical Co., Ltd. | 60 | 60 | 60 | 60 |
|  | Epoxy Resin (Parts By Mass) | jER828 | Mitsubishi Chemical Corporation | 40 |  | 40 |  |
|  | Thermal Cationic Polymerization Initiator (Parts By Mass) | SI-60L | Sanshin Chemical Industry Co., Ltd. | 2 |  | 2 |  |
|  | Acrylate (Parts By Mass) | EB600 | Daicel-Allnex Ltd. |  | 40 |  | 40 |
|  | Organic Peroxide (Parts By Mass) | Perhexyl Z | NOF Corporation |  | 2 |  | 2 |
| Minimum Melt Viscosity of Third Connection Layer | | [mPa · s] | | 500 | 500 | 500 | 500 |
| [Minimum Melt Viscosity of First Connection Layer]/ [Minimum Melt Viscosity of Second or Third Connection Layer] | | | | 40 | 40 | 40 | 40 |
| Conduction Resistance Value | | Initial | | 0.2 | 0.2 | 0.2 | 0.2 |
|  |  | 85° C., 85% RH, 500 hr | | 5 | 5 | 8 | 8 |
| Insulating Properties (Rate of Occurrence of Short Circuit) | | [ppm] | | 30 | 30 | 30 | 30 |
| Particle Capturing Efficiency | | [%] | | 85 | 82 | 83 | 87 |

As seen from Table 1, the anisotropic conductive films of Examples 1 to 6 exhibit preferable results in practical terms in all evaluation items of particle capturing efficiency, conduction reliability, and insulating properties. As seen from the results in Examples 1 to 4, when the first, second, and third connection layers are all the same curing system, the layers are reacted with one another. Therefore the pressing property of the conductive particles slightly decreases and the conduction resistance tends to increase. Further, when the first connection layer is a cationic polymerization system, the thermal resistance is improved as compared with a radical polymerization system. Therefore the pressing property of the conductive particles slightly decreases and the conduction resistance tends to increase.

On the other hand, in the first connection layer of the anisotropic conductive film of Comparative Example 1, the thickness of the insulating resin layer in central regions between adjacent ones of the conductive particles is not smaller than that of the insulating resin layer in regions in proximity to the conductive particles. Therefore, the conduction reliability is largely reduced. In the anisotropic conductive film of Comparative Example 2 that has a conventional two-layer structure, the particle capturing efficiency largely decreases, and the insulating properties has a problem.

As seen from Table 2, the anisotropic conductive films of Examples 7 to 10 have a thickness in central regions between the conductive particles of zero. Therefore, the independence of the conductive particles is enhanced, and the anisotropic conductive films exhibit preferable results in practical terms in all evaluation items of particle capturing efficiency, conduction reliability, and insulating properties.

INDUSTRIAL APPLICABILITY

In the anisotropic conductive film of the present invention that has a three-layer structure in which the first connection layer is sandwiched between the second and third connection layers that each are insulative, the first connection layer has a structure in which conductive particles are arranged in a single layer in a plane direction of an insulating resin layer on a side of the second connection layer, and a structure in which the thickness of the insulating resin layer at a center between adjacent ones of the conductive particles is smaller than that of the insulating resin layer in regions in proximity to the conductive particles. For this reason, the anisotropic conductive film having the conductive particles arranged in a single layer is allowed to achieve favorable connection reliability, favorable insulating properties, and favorable particle capturing efficiency. Therefore, the anisotropic conductive film is useful in anisotropic conductive connection of an electronic component such as an IC chip to a circuit board.

REFERENCE SIGNS LIST

1 first connection layer
1X region where the degree of cure in the first connection layer is low
1Y region where the degree of cure in the first connection layer is high
1d coating layer
2 second connection layer
3 third connection layer
3a surface of third connection layer
4 conductive particle
10 insulating resin layer
20 transfer die
21 opening
22 release film
100 anisotropic conductive film
L distance between conductive particles
P midpoint of distance between conductive particles
t1, t2 insulating resin layer thickness

The invention claimed is:
1. An anisotropic conductive film, comprising
a first connection layer comprised of an insulating resin and a second connection layer comprised mainly of an insulating resin, the insulating resin of the second connection layer being the same or different from the insulating resin of the first connection layer, and the second connection layer being formed to have direct contact with the first connection layer, wherein conductive particles are arranged in the first connection layer, and wherein a boundary between the first connection layer and the second connection layer has an undulating shape as a result of a thickness t1 of the insulating resin of the first connection layer in central regions between adjacent conductive particles being less than a thickness t2 of the insulating resin of the first connection layer in regions in proximity to the conductive particles, and wherein the thicknesses t1 and t2 satisfy the following relation: $0.1 \times t2 < t1 < 0.9 \times t2$.

2. The anisotropic conductive film according to claim 1, wherein the insulating resin of the first connection layer that is in proximity to edges of the conductive particles and that is at the boundary between the first connection layer and the second connection layer inclines with respect to a plane direction of the anisotropic conductive film.

3. The anisotropic conductive film according to claim 1, wherein the insulating resin of the first connection layer in proximity to the conductive particles has a convex shape.

4. The anisotropic conductive film according to claim 1, wherein the conductive particles are isolatedly arranged in the first connection layer.

5. The anisotropic conductive film according to claim 1, wherein the conductive particles dig into the second connection layer.

6. The anisotropic conductive film according to claim 2, wherein the insulating resin of the first connection layer in proximity to the conductive particles has a convex shape.

7. The anisotropic conductive film according to claim 2, wherein the conductive particles are isolatedly arranged in the first connection layer.

8. The anisotropic conductive film according to claim 2, wherein the conductive particles dig into the second connection layer.

9. The anisotropic conductive film according to claim 3, wherein the conductive particles are isolatedly arranged in the first connection layer.

10. The anisotropic conductive film according to claim 3, wherein the conductive particles dig into the second connection layer.

11. The anisotropic conductive film according to claim 4, wherein the conductive particles dig into the second connection layer.

12. A connection structure, comprising a first electronic component and a second electronic component connected thereto by anisotropic conductive connection using the anisotropic conductive film according to claim 1.

13. A method of producing a connection structure, comprising connecting a first electronic component to a second electronic component by anisotropic conductive connection using the anisotropic conductive film according to claim 1.

* * * * *